United States Patent
Hirai et al.

(10) Patent No.: US 9,685,301 B2
(45) Date of Patent: Jun. 20, 2017

(54) CHARGED-PARTICLE RADIATION APPARATUS

(71) Applicant: Hitachi High-Technologies Corporation, Minato-ku, Tokyo (JP)

(72) Inventors: Takehiro Hirai, Tokyo (JP); Ryo Nakagaki, Tokyo (JP); Kenji Obara, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/433,891

(22) PCT Filed: Oct. 11, 2013

(86) PCT No.: PCT/JP2013/077725
§ 371 (c)(1),
(2) Date: Apr. 7, 2015

(87) PCT Pub. No.: WO2014/061577
PCT Pub. Date: Apr. 24, 2014

(65) Prior Publication Data
US 2015/0279614 A1 Oct. 1, 2015

(30) Foreign Application Priority Data
Oct. 16, 2012 (JP) ................................ 2012-229221

(51) Int. Cl.
*H01J 37/28* (2006.01)
*H01J 37/22* (2006.01)

(52) U.S. Cl.
CPC ............ *H01J 37/222* (2013.01); *H01J 37/28* (2013.01); *H01J 2237/24592* (2013.01)

(58) Field of Classification Search
CPC ................ H01J 37/222; H01J 37/28; H01J 2237/24592; H01J 2237/2817
See application file for complete search history.

(56) References Cited

U.S. PATENT DOCUMENTS

| 2003/0111602 A1* | 6/2003 | Sato ...................... G01N 23/22 250/310 |
| 2003/0141451 A1 | 7/2003 | Sato et al. |

(Continued)

FOREIGN PATENT DOCUMENTS

| JP | WO 2012014363 A1 * | 2/2012 | ........... G06K 9/6202 |
| KR | 10-2011-0063803 A | 6/2011 | |

(Continued)

OTHER PUBLICATIONS

International Search Report (PCT/ISA/210) dated Dec. 17, 2013 with English translation (three pages).

(Continued)

*Primary Examiner* — Jack Berman
*Assistant Examiner* — Eliza Osenbaugh-Stewar
(74) *Attorney, Agent, or Firm* — Crowell & Moring LLP

(57) ABSTRACT

The present invention provides a charged-particle radiation apparatus with a defect observation device for observing defects on a sample, the apparatus including a control unit and a display unit. The control unit is configured to execute a drift correction process on one or more images acquired with the defect observation device under a plurality of correction conditions, and display the plurality of correction conditions and a plurality of corrected images obtained through execution of the drift correction process in association with each other, as a first screen on the display unit.

17 Claims, 10 Drawing Sheets

(56) References Cited

U.S. PATENT DOCUMENTS

| | | | |
|---|---|---|---|
| 2007/0029478 A1 | 2/2007 | Sato et al. | |
| 2008/0217535 A1 | 9/2008 | Sato et al. | |
| 2011/0249110 A1* | 10/2011 | Okai | G01B 15/00 |
| | | | 348/80 |
| 2011/0261190 A1* | 10/2011 | Nakagaki | G06T 7/001 |
| | | | 348/126 |
| 2012/0287258 A1 | 11/2012 | Tsuneta et al. | |

FOREIGN PATENT DOCUMENTS

| | | |
|---|---|---|
| WO | WO 03/044821 A1 | 5/2003 |
| WO | WO 2010/070815 A1 | 6/2010 |
| WO | WO 2011/089911 A1 | 7/2011 |

OTHER PUBLICATIONS

Japanese-language Written Opinion (PCT/ISA/237) dated Dec. 17, 2013 (three pages).
Korean-language Office Action issued in counterpart Korean Application No. 10-2015-7009047 dated Mar. 21, 2016 (5 pages).

\* cited by examiner

CHARGED-PARTICLE RADIATION APPARATUS

TECHNICAL FIELD

The present invention relates to a charged-particle radiation apparatus with a defect observation device for observing defects on a semiconductor device.

BACKGROUND ART

In order to obtain high yields in production of semiconductors, it is important to take measures by finding defects that are generated in production steps at an early stage. In recent years, defects that have influence on yields have come in a variety of types with a reduction in the size of semiconductors, and the number of production steps that should be observed has also increased. For example, there have been increased cases where a production step in which image drift is generated due to electrostatic charge on a sample is subjected to defect observation.

A SEM (Scanning Electron Microscope) defect observation apparatus is an apparatus for observing such a variety of types of defects, and is typically an apparatus for observing an image of a defect position, which has been detected with an upstream defect inspection apparatus, with higher image quality than that of the upstream defect inspection apparatus. Specifically, a sample stage is moved to defect coordinates output from the upstream defect inspection apparatus, and then, an image is captured at a low magnification at about a level that allows the field of view to contain the target defect to be observed. Then, the correct defect position is identified, and the sample stage is moved so that the defect position is located at the center of the field of view or the center of image capturing is moved, and then, an image to be observed is acquired at a high magnification that is suitable for defect observation. As described above, a defect position is identified with a low-magnification image because defect coordinates output from the upstream defect inspection apparatus contain errors within the range of the specifications of the apparatus. Thus, when a high-quality defect image is acquired with a SEM defect observation apparatus, a process of correcting such errors should be performed. ADR (Automatic Defect Review or Redetection) is a technique of automating a step of acquiring a high-quality defect image.

In ADR, the conditions to acquire a low-magnification image, the conditions to acquire a high-magnification image, and the like should be optimized in accordance with the defect coordinate detection accuracy of the upstream defect inspection apparatus and the properties of a sample in order to obtain both a high defect detection rate of ADR and high throughput of ADR including the image acquisition time. However, the defect detection rate and the throughput of ADR are typically in trade-off relationship, and thus, determining optimal conditions is difficult work even for a person with experience and expertise. Therefore, it is desired to simplify the operation of setting optimal conditions.

Meanwhile, ADC (Automatic Defect Classification), which is a technique of automating a step of classifying defects by type on the basis of a defect image acquired with high quality, has also been put into practical use. In particular, the range of steps to which ADC is applied in production lines is expanding. In ADC, the defect classification accuracy rate of ADC and the throughput of ADC including the image acquisition time are also in trade-off relationship, and thus, determining optimal conditions is difficult work. Therefore, it is desired to simplify the operation of setting optimal conditions.

Patent Literature 1 discloses a technique of, with a scanning electron microscope, acquiring a plurality of frame images, which have been obtained by scanning the observation field of view, calculating the drift amount between the frame images, and overlaying the frame images with one another while correcting the drift amount, thereby obtaining a clear image even when image drift is generated.

CITATION LIST

Patent Literature

Patent Literature 1: WO 2010/070815 A

SUMMARY OF INVENTION

Technical Problem

However, the technique disclosed in Patent Literature 1 is targeted for image drift that occurs when automatic length measurement is performed. According to Patent Literature 1, a length measurement value for a high-magnification image can be stably calculated, but when applied to a defect observation apparatus, the following problems would occur.

In a scanning electron microscope that is intended to automatically measure a production pattern as supposed in Patent Literature 1, the user sets a production pattern to be measured for each sample or recipe. Thus, the types of production patterns that are measured on a single sample or recipe are limited. That is, in automatic length measurement, a predetermined production pattern is measured at predetermined coordinates. Thus, there is no possibility that an optimal parameter may vary from sample to sample, for example.

In contrast, a SEM defect observation apparatus acquires an image at a defect position detected with an upstream defect observation apparatus. Thus, coordinates and a production pattern that should be obtained will vary depending on the defect position. Thus, even on a single sample or recipe, there may be a variety of coordinate positions and production patterns that should be acquired. Accordingly, the degree of image drift generated due to electrostatic charge will also vary from production pattern to production pattern and the like on the acquired image. Thus, setting an optimal parameter is an object to be achieved. Conventionally, there have been few cases where a production step in which image drift is generated is subjected to defect observation. However, with a reduction in the size of semiconductors and an increase in the complexity of production steps in recent years, there has been an increasing need to, even for a production step in which image drift is generated, acquire a defect image with higher quality and analyze the defect with a SEM defect observation apparatus.

The present invention has been made in view of the foregoing, and provides a technique that can, with a charged-particle radiation apparatus with a defect observation device, easily determine optimal parameter conditions for an observed image even when image drift is generated.

Solution to Problem

In order to solve the above problem, the configurations recited in the claims are adopted, for example. Although the present application contains a plurality of means for solving the problem, an example thereof includes a charged-particle radiation apparatus with a defect observation device for observing defects on a sample, and includes a control unit and a display unit. The control unit is configured to execute a drift correction process on one or more images, which have been acquired with the defect observation device, under a plurality of correction conditions, and display the plurality of correction conditions and a plurality of corrected images obtained through execution of the drift correction process in association with one another, as a first screen on the display unit.

Advantageous Effects of Invention

According to the present invention, it is possible to easily determine, with a charged-particle radiation apparatus with a defect observation device, optimal parameter conditions for an observed image even when image drift is generated.

Further features related to the present invention will become apparent from the description of the specification and the accompanying drawings. In addition, problems, configurations, and advantageous effects other than those described above will become apparent from the following description of embodiments.

DESCRIPTION OF EMBODIMENTS

Hereinafter, embodiments of the present invention will be described with reference to the accompanying drawings. Although the accompanying drawings illustrate specific embodiments in accordance with the principle of the present invention, they are illustrative only for understanding of the present invention and thus should not be used to narrowly construe the present invention.

A charged-particle radiation apparatus is an apparatus for irradiating a sample with particles with electric charge (charged particles), such as electrons and cations, by accelerating the particles with an electric field. A charged-particle radiation apparatus performs observation, analysis, processing, and the like of a sample using interaction between the sample and charged particles. Examples of a charged-particle radiation apparatus include electron microscopes, electron beam drawing apparatuses, ion processing apparatuses, and ion microscopes. Among such charged-particle radiation apparatuses, a scanning electron microscope (SEM) is an apparatus that observes a microstructure or analyzes constituent elements by irradiating a sample with electrons and detecting interaction between the electrons and the sample as a signal. Hereinafter, a SEM defect observation apparatus will be described as an example of a charged-particle radiation apparatus with a defect observation device.

Hereinafter, an exemplary configuration of a SEM defect observation apparatus will be described. Although an example in which a SEM defect observation apparatus sets a recipe will be described as an exemplary configuration of the system, the system configuration is not limited thereto, and the apparatuses that constitute the system may be partially or entirely constructed from different apparatuses. For example, a recipe setting process in this embodiment may be performed by a recipe management apparatus that is connected to the SEM defect observation apparatus over a network, or an automatic defect classification apparatus.

A SEM defect observation apparatus is an apparatus that, upon receiving as input information defect coordinates, which have been detected with an upstream defect inspection apparatus, such as an optical or SEM inspection apparatus, or coordinate information on the observation points extracted through simulation or the like based on the design layout data, acquires a high-quality SEM image of the defect coordinates or the observation coordinates under the conditions that are suitable for observation or analysis.

Figure 1:
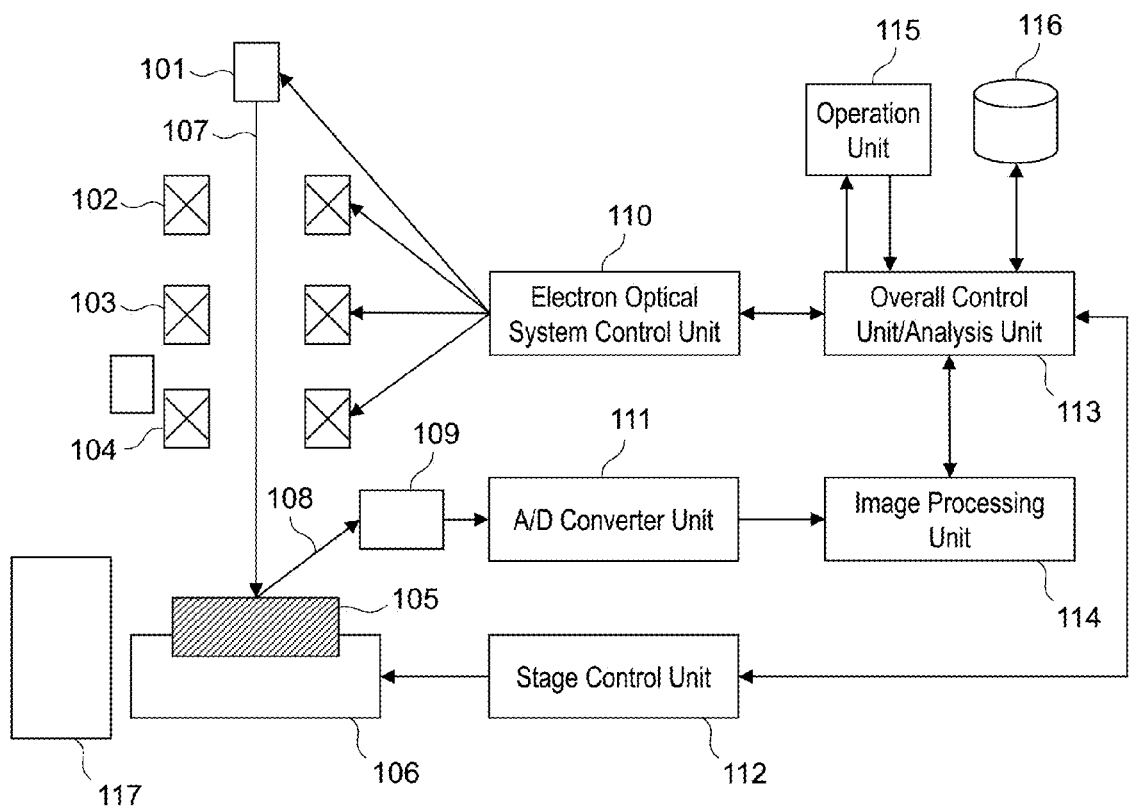
FIG. 1 is a schematic diagram showing the overall configuration of a SEM defect observation apparatus of the present invention.

FIG. 1 is a schematic diagram showing the overall configuration of the SEM defect observation apparatus in this embodiment. The SEM defect observation apparatus in FIG. 1 has an electron optical system including optical components, such as an electron gun 101, a lens 102, a scanning deflector 103, an objective lens 104, a sample 105, and a secondary particle detector 109.

The SEM defect observation apparatus also includes a stage 106 for moving a sample table, which holds the sample 105 to be observed, in the XY plane, an electron optical system control unit 110 that controls the variety of optical components included in the electron optical system, an A/D converter unit 111 that quantizes an output signal of the secondary particle detector 109, and a stage control unit 112 that controls the stage 106. The aforementioned electron optical system, the electron optical system control unit 110, the A/D converter unit 111, the stage 106, and the stage control unit 112 constitute a scanning electron microscope (SEM) that is a means for capturing a SEM image. In addition, the SEM defect observation apparatus may also include an optical microscope 117 as an upstream defect inspection apparatus.

Further, the SEM defect observation apparatus includes an overall control unit/analysis unit 113, an image processing unit 114, an operation unit 115, and a storage device 116. The operation unit 115 includes a display (i.e., display unit), a keyboard, a mouse, and the like. The storage device 116 stores images acquired with the SEM.

In the SEM defect observation apparatus, a primary electron beam 107 emitted from the electron gun 101 is converged by the lens 102, and is deflected by the scanning deflector 103. Further, the primary electron beam 107 is, after being deflected by the scanning deflector 103, converted by the objective lens 104 and irradiates the sample 105.

Secondary particles 108, such as secondary electrons and reflected electrons, are generated from the sample 105 irradiated with the primary electron beam 107 in accordance with the shape and the material of the sample 105. The generated secondary particles 108 are detected by the secondary particle detector 109, and are then converted into a digital signal by the A/D converter unit 111. An output signal of the secondary particle detector 109 converted into a digital signal may sometimes be referred to as an image signal.

The output signal of the A/D converter unit 111 is output to the image processing unit 114, and then, the image processing unit 114 forms a SEM image. The image processing unit 114 executes a drift correction process using the generated SEM image. The image processing unit 114 may also execute, using the generated SEM image, a variety of image analyzing processes, such as an ADR process for executing image processing like detection of defects and an ADC process for automatically classifying defects by type.

Control of the electron optical system, such as the lens 102, the scanning deflector 103, and the objective lens 104, is executed by the electron optical system control unit 110. In addition, position control of the sample 105 is executed by the stage 106 controlled by the stage control unit 112. The overall control unit/analysis unit 113 is a control unit that controls the entire SEM defect observation apparatus. The overall control unit/analysis unit 113 controls the electron optical system control unit 110, the stage control unit 112, the image processing unit 114, and the like by processing information input from the operation unit 115, which includes the display, the keyboard, the mouse, and the like, and from the storage device 116, and then outputs the processing results to the display unit included in the operation unit 115 and to the storage device 116 as needed.

The image processing unit 114 and the overall control unit/analysis unit 113 are constructed from information processing devices, such as computers. For example, the overall control unit/analysis unit 113 includes a CPU, a storage unit (e.g., memory and a hard disk), and the operation unit 115 that includes the display, the keyboard, the mouse, and the like. In such a case, the overall control unit/analysis unit 113 can be implemented by software, and can be implemented by executing a program of a desired computation process with a CPU. Similarly, the image processing unit 114 can also be implemented by software. It should be noted that the image processing unit 114 and the overall control unit/analysis unit 113 may be constructed from either separate information processing devices or a single information processing device.

A process that is executed by the image processing unit 114 and the overall control unit/analysis unit 113 can also be implemented by hardware. When the process is executed by hardware, the process can be implemented by integrating a plurality of computing units for performing the process on a wiring board or a semiconductor chip or within a package.

Figure 2:
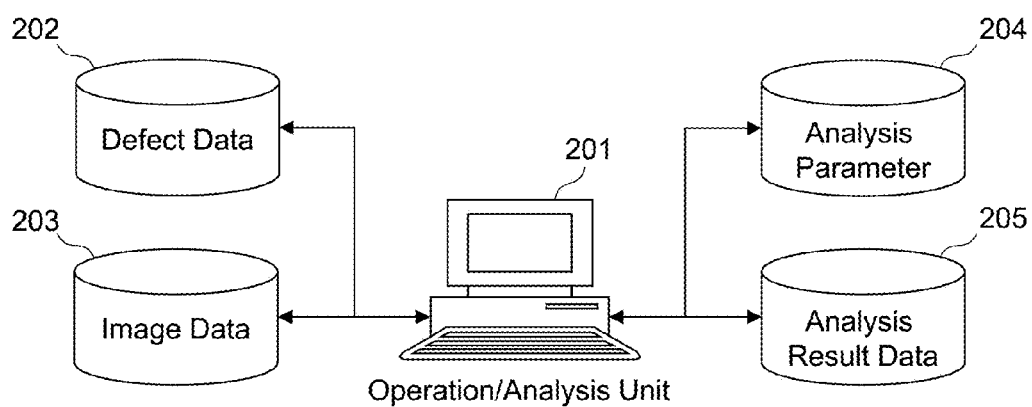
FIG. 2 is a diagram showing the details of an overall control unit/an analysis unit in FIG. 1.

FIG. 2 is a diagram showing the details of the overall control unit/analysis unit 113 in FIG. 1. An operation/analysis unit 201 shown in FIG. 2 represents a combination of the overall control unit/analysis unit 113 and the operation unit 115 in FIG. 1.

The operation/analysis unit 201 includes a defect data storage unit 202, an image data storage unit 203, an analysis parameter storage unit 204, and an analysis result data storage unit 205. The defect data storage unit 202, the image data storage unit 203, the analysis parameter storage unit 204, and the analysis result data storage unit 205 may be constructed from a hard disk of the information processing device that constitutes the overall control unit/analysis unit 113. In addition, when the operation/analysis unit 201 is incorporated in the SEM defect observation apparatus shown in FIG. 1, the defect data storage unit 202, the image data storage unit 203, the analysis parameter storage unit 204, and the analysis result data storage unit 205 may be integrated with the storage device 116 in FIG. 1.

The defect data storage unit 202 stores defect information, such as defect coordinates, detected with an upstream inspection apparatus. The image data storage unit 203 stores a defect image captured with the SEM defect observation apparatus. Herein, the defect image may include a low-magnification image captured with the defect inspection apparatus and a high-magnification image after subjected to an ADR process. The analysis parameter storage unit 204 stores a plurality of execution conditions (i.e., a plurality of parameters) that are executed when an image is acquired or analyzed. Examples of the plurality of execution conditions include parameters, such as the number of integrated frames, the voltage value of the accelerating voltage, and the current value of the probe current. In addition, as the plurality of execution conditions, parameters, such as ADR conditions or ADC conditions, may also be stored. The analysis result data storage unit 205 stores data on the processing results obtained by the operation/analysis unit 201. For example, the analysis result data storage unit 205 stores images processed under a plurality of execution conditions, information on the processing time or throughput when a process was performed under each execution condition.

The operation/analysis unit 201 executes a predetermined program with the CPU incorporated in the overall control unit/analysis unit 113 in response to an operation instruction from the operation unit 115. Accordingly, the operation/analysis unit 201 can implement a plurality of functions. For example, the operation/analysis unit 201 acquires defect information from the defect data storage unit 202, and acquires a defect image from the image data storage unit 203. Then, the operation/analysis unit 201 acquires a plurality of execution conditions from the analysis parameter storage unit 204, and executes a process on the defect image under each execution condition. The operation/analysis unit 201 stores information, such as an image on which a process was executed, into the analysis result data storage unit 205.

It should be noted that the overall control unit/analysis unit 113 such as the one shown in FIG. 1 is not limited to the configuration incorporated in the SEM defect observation apparatus, and may also be constructed by providing the operation/analysis unit 201 shown in FIG. 2 independently of the SEM defect observation apparatus shown in FIG. 1.

In such a case, the SEM defect observation apparatus and the operation/analysis unit 201 are connected over a network, for example.

Figure 3:
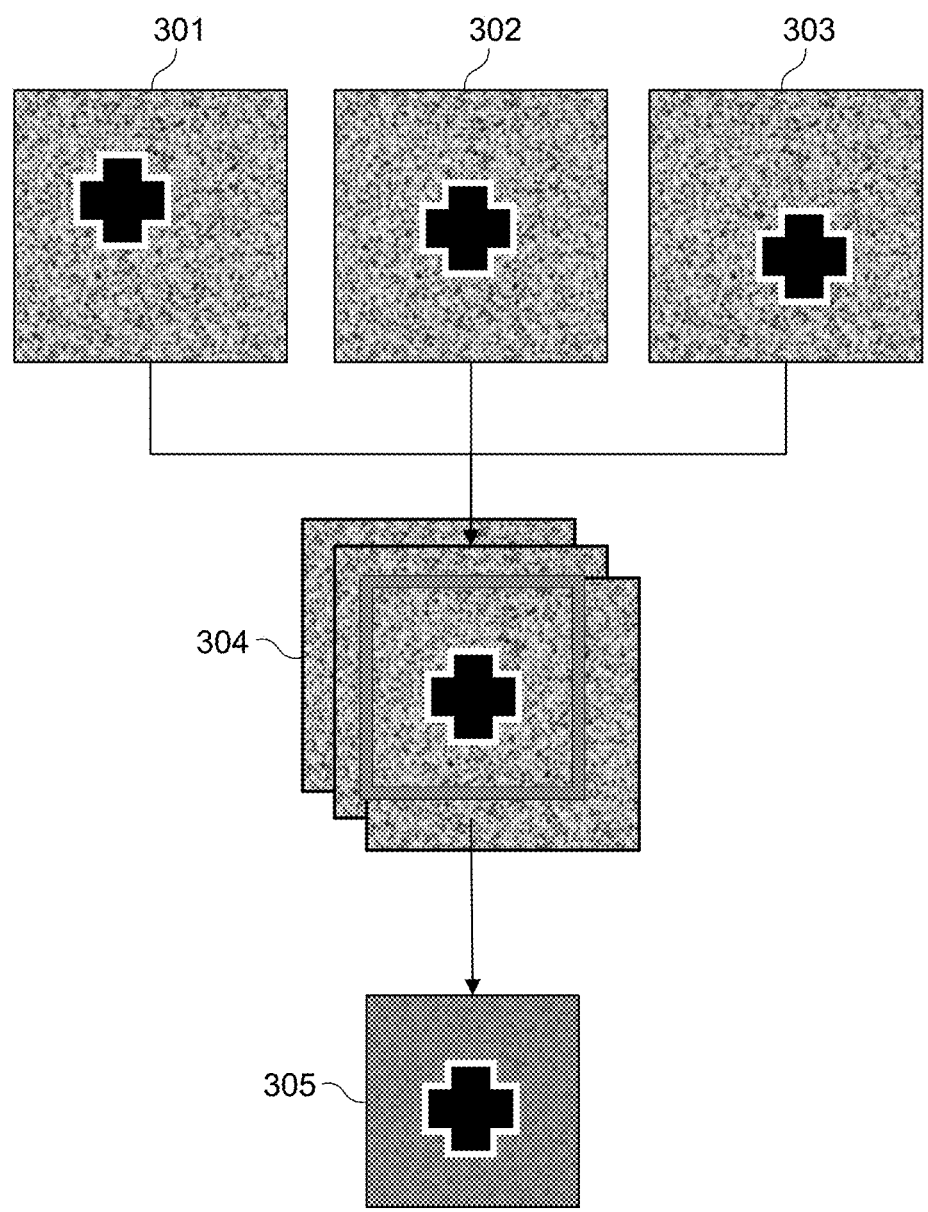
FIG. 3 is a conceptual diagram of correction of image drift.

FIG. 3 is a conceptual diagram of correction of image drift. Herein, an example will be described in which drift correction is executed on three frame images having drift generated therein that include a first frame image 301, a second frame image 302, and a third frame image 303. First, the drift amount of the first frame image 301 is calculated with reference to the second frame image 302, and integration is performed by shifting the position of overlay by an amount corresponding to the calculated drift amount (304). Similarly, the drift amount of the third frame image 303 is calculated with reference to the second frame image 302, and integration is performed by shifting the position of overlay by an amount corresponding to the calculated drift amount (304). A frame integrated image 304 is the result obtained by overlaying the three frame images with one another while taking the calculated drift amounts into consideration.

In the illustrated example of FIG. 3, the drift amounts are calculated with reference to the second frame image 302. However, the drift amounts may also be calculated with reference to the initially acquired first frame image 301, or it is also possible to repeat a process of calculating a drift amount between consecutive frame images. In addition, although a portion that is common to a total of three frame images 301, 302, and 303 is cut out from the frame integrated images 304 as a final drift corrected image 305 herein, it is also possible to perform a process of filling an area, which is lacking with respect to a desired image size, with a specific pixel value, or filling a lacking area with a pixel value that has been calculated from peripheral pixel values through image processing. Such an image drift correction process is executed by the image processing unit 114. It should be noted that the image drift correction process may also be executed by the overall control unit/analysis unit 113.

First Embodiment

Figure 4:
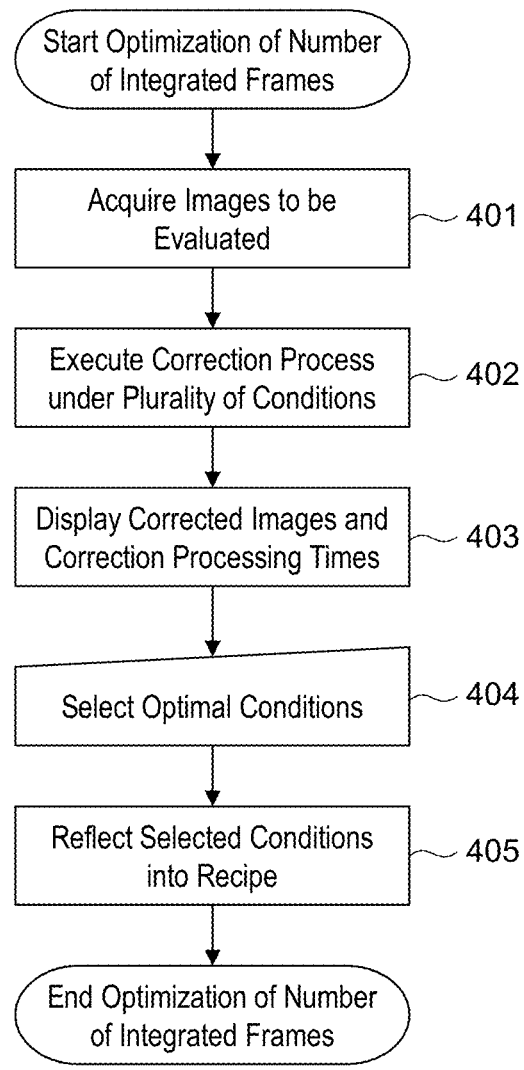
FIG. 4 is a flowchart of a process of setting the number of integrated frames in accordance with the first embodiment.

Hereinafter, a process of optimizing the execution conditions in accordance with the first embodiment of the SEM defect observation apparatus will be described. FIG. 4 is a flowchart of a process of optimizing the number of integrated frame images. Hereinafter, a process of optimizing the number of integrated frame images will be described as an example of the execution conditions. Herein, a subject that performs the following process is the overall control unit/analysis unit 113.

In step 401, the overall control unit/analysis unit 113 first acquires from the analysis parameter storage unit 204 a plurality of parameters regarding the number of integrated frames. In addition, the overall control unit/analysis unit 113 acquires from the image data storage unit 203 the maximum number of frame images to be evaluated.

In step 402, the overall control unit/analysis unit 113, using the image processing unit 114, executes a drift correction process by changing the number of integrated frames for the acquired frame images (i.e., in accordance with the plurality of acquired parameters). The overall control unit/analysis unit 113 stores the execution results of the drift correction process and the like into the analysis result data storage unit 205.

Next, in step 403, the overall control unit/analysis unit 113 displays on the display unit (e.g., display) of the operation unit 115 a list of the numbers of integrated frames and images obtained through execution of the drift correction process for the respective numbers of integrated frames such that the correspondence therebetween can be seen. The details of the screen of the display unit of the operation unit 115 are described in detail below.

Next, in step 404, the user selects an optimal image from among the displayed list of the drift corrected images. The overall control unit/analysis unit 113 receives information on the image selected by the user via the operation unit 115. Accordingly, optimal drift correction conditions can be easily set.

Finally, in step 405, the overall control unit/analysis unit 113 reflects the set drift correction conditions into a recipe stored in the storage device 116. Accordingly, the drift correction conditions can be applied to the next and subsequent defect observation. According to such a flowchart, the user is able to easily set optimal drift correction conditions.

Figure 5:
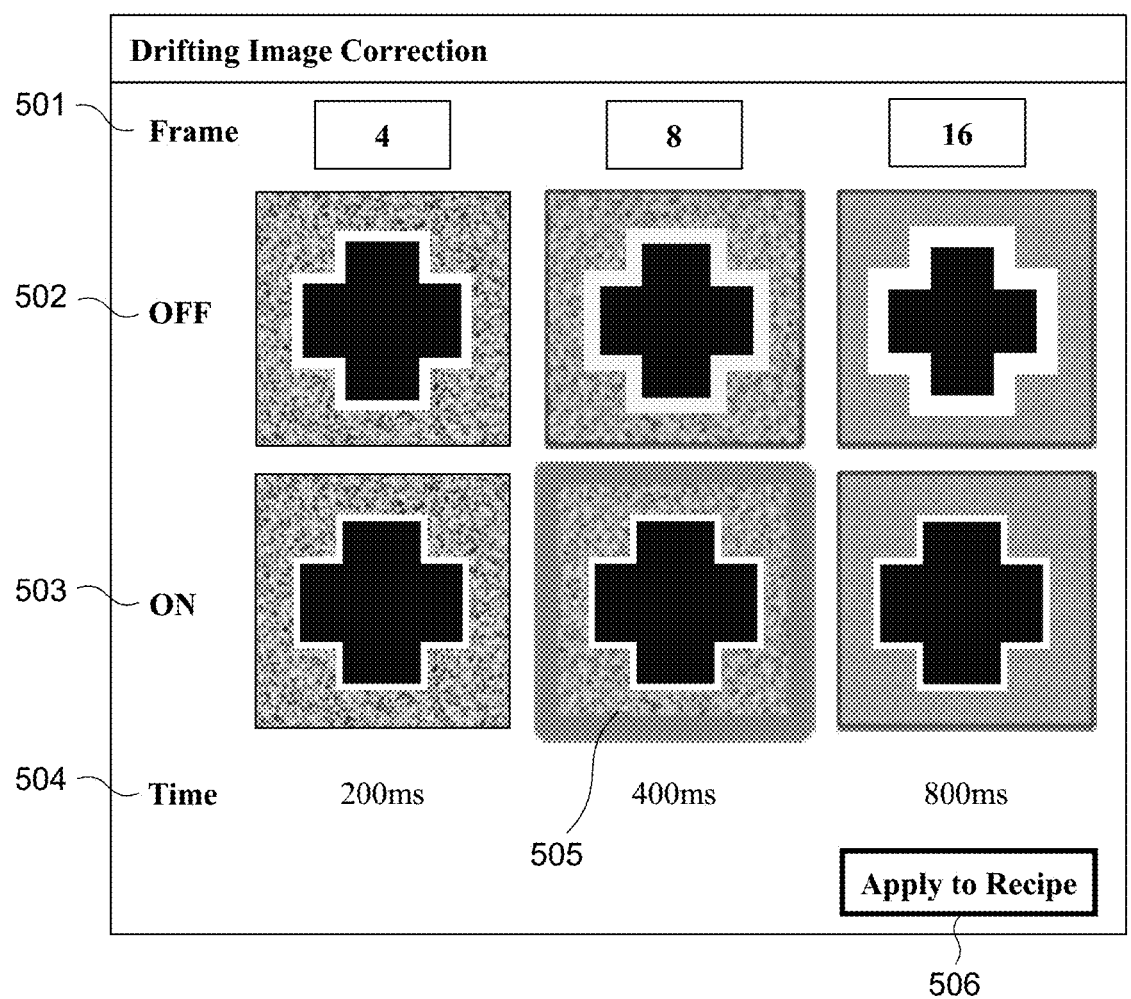
FIG. 5 illustrates an exemplary GUI for setting the optimization of the number of integrated frame images, which is a first example of a screen displayed in step 403 of FIG. 4.

FIG. 5 illustrates an exemplary GUI (i.e., first screen) for setting the optimization of the number of integrated frame images, which is the first example of a screen displayed in step 403 of FIG. 4.

The GUI in FIG. 5 includes a display portion 501 for displaying the number of integrated frames, a pre-correction-process image display portion 502 for displaying integrated images before a correction process, a post-correction-process image display portion 503 for displaying integrated images after a correction process, and a processing time display portion 504 for displaying the execution time of a correction process.

The display portion 501 for displaying the number of integrated frames displays the number of integrated frames to be evaluated to comparatively evaluate the minimum number of integrated frames, double the minimum number of integrated frames, and four times the minimum number of integrated frames. It should be noted that the number of integrated frames may be selected not only with this method but also by combining the minimum value, the median, and the maximum value. Further, the number of integrated frames need not be a fixed value, and may be freely set by the user. Furthermore, the types of the number of integrated frames that are compared are not limited to three, and it is also possible to adopt a method of displaying a list of all of the numbers of integrated frames to be evaluated, or a method of repeating a selection process a plurality of times so as to gradually narrow the numbers down to an optimal value.

The pre-correction-process image display portion 502 displays an integrated image before a correction process for each number of integrated frames. As shown in FIG. 5, when frame images are integrated with image drift having been generated, a deviation of an edge portion of a pattern, which is contained in the resulting image to be evaluated, is displayed in a noticeable manner (thick). As image drift is generated in this example, a deviation of an edge portion of a pattern, which is contained in the resulting image to be evaluated, is displayed in a more noticeable manner as the number of integrated frames is increased. It should be noted that samples that are subjected to defect observation also include samples that need not be subjected to a drift correction process. Thus, by displaying frame integrated images not subjected to a drift correction process, it is possible to determine whether or not a drift correction process is necessary.

The post-correction-process image display portion 503 displays an integrated image after a correction process for each number of integrated frames. By the correction process, the deviation of the edge portion of the pattern has become smaller for each number of integrated frames. As described above, an image before a correction process and an image after a correction process, which correspond to each number of integrated frames, are displayed such that the images can be associated with the number of integrated frames.

The processing time display portion 504 displays a drift correction processing time such that the correspondence between the drift correction processing time, each number of integrated frames, and each frame integrated image can be seen. The user is able to easily select optimal conditions from among combinations each including the drift corrected image (503), which has been obtained by actually executing a drift correction process, and the processing time (504) needed to perform the drift correction process. In the example of FIG. 5, an image obtained by integrating eight frames is selected (505). When a button 506 is pressed after selecting an optimal image, the selected optimal conditions (herein, the number of integrated frames=8) is stored in a recipe as the next and subsequent drift correction conditions.

Figure 6:
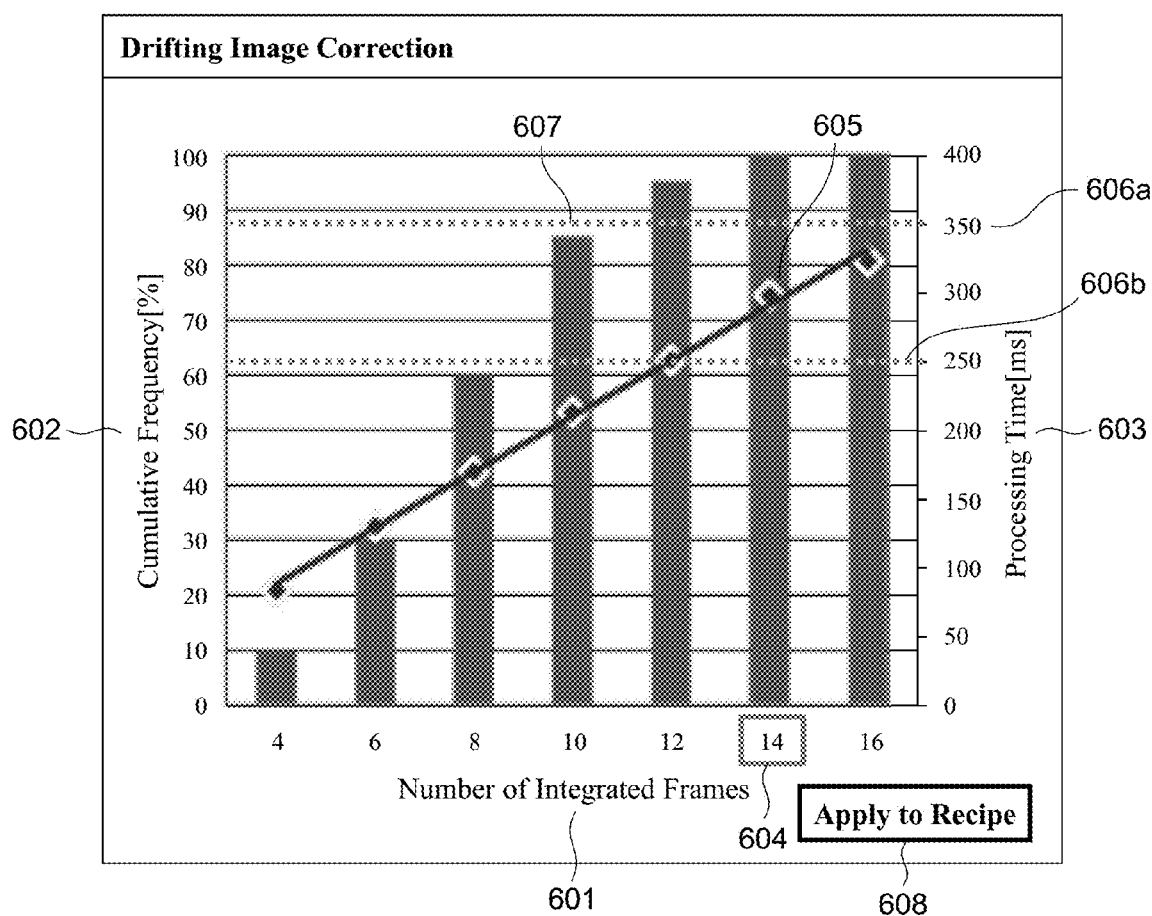
FIG. 6 illustrates an exemplary GUI for setting the optimization of the number of integrated frame images, which is a second example of a screen displayed in step 403 of FIG. 4.

Hereinafter, an example of another screen that is displayed in setting the optimization of the number of integrated frame images will be described. FIG. 6 illustrates an exemplary GUI (i.e., second screen) for setting the optimization of the number of integrated frame images, which is the second example of a screen displayed in step 403 of FIG. 4.

When defect coordinates, which have been detected with an upstream defect inspection apparatus, are observed with a SEM defect observation apparatus, there may be a variety of types of production patterns that have defects generated therein. Thus, it is important to set conditions that correspond to a variety of types of production patterns. Ideally, if there is an effective parameter for a variety of types of production patterns, such a parameter may be adopted. However, such a parameter typically needs a long processing time. Thus, the user should set an optimal parameter, taking into consideration a balance with the processing time. Such an operation, however, has a high difficulty level.

FIG. 6 illustrates the cumulative frequency of the results obtained by applying the setting of the optimization of the number of integrated frames, which is exemplarily shown in FIG. 5, to a plurality of evaluated samples. In the graph of FIG. 6, the abscissa axis indicates the number 601 of integrated frames, the ordinate axis (left) indicates the cumulative frequency 602, and the ordinate axis (right) indicates the drift correction processing time 603. In the graph of FIG. 6, the average drift correction processing time for each number of integrated frames is plotted, and an approximate line 605 of the plotted points is displayed. Although an approximate line of the correction processing time is displayed in the example shown in FIG. 6, there may be cases where the plotted points are not displayed in a straight line depending on the correction processing algorithm used. In such cases, the plotted points may be displayed in an approximate curve. It is acceptable as long as the cumulative frequency for a plurality of evaluated samples as well as the drift correction processing time for each number of integrated frames can be checked.

When such a graph is displayed, it is possible to comprehensively check a result that has been determined to be optimal by the user for a plurality of evaluated samples. For example, it is possible to determine the minimum number of integrated frames that can realize a satisfactory image quality for the user for all of the evaluated samples from the number of integrated frames (604) at which the cumulative frequency is 100%. In the example shown in FIG. 6, the cumulative frequency is 100% when the number of integrated frames is 14. Thus, when the number of integrated frames is set to 14, it is possible to obtain an image quality that has been determined to be optimal by the user for all of the evaluated samples. In such a case, it can be confirmed that the drift correction processing time is about 300 ms.

When there is a restriction on the drift correction processing time, it is possible to display the restriction drift correction processing times 606a and 606b, for example. Such restriction time may be set in advance or be freely input by the user. For example, reference numeral 606a indicates a case where the restriction time of the restriction drift correction processing time is set to 350 ms. In this case, the drift correction processing times for all numbers of integrated frames are within the restriction time. Thus, the user may select the number of integrated frames at which the cumulative frequency is 100%.

For example, reference numeral 606b indicates a case where the restriction time of the restriction drift correction processing time is set to 250 ms. It is seen that such a restriction time is satisfied when the number of integrated frames is less than or equal to 12. Herein, when the number of integrated frames is 12, the cumulative frequency is 95%. Thus, it can be confirmed that the image quality that is determined to be optimal by the user is about 95%. It is seen that when there is such a restriction on time, the user is able to obtain an almost satisfactory image quality by setting the number of integrated frames to 12. As described above, it is possible to select an optimal parameter by taking into consideration both the cumulative frequency 602 and the drift correction processing time 603 for each number of integrated frames. When the user presses the button 608 after selecting an optimal number of integrated frames, the selected optimal conditions (herein, the number of integrated frames=14) are stored in a recipe as the next and subsequent drift correction conditions.

Although the aforementioned example illustrates a process of optimizing the number of integrated frames as an example of the execution conditions, the execution conditions (i.e., parameter) that are optimized are not limited to the number of integrated frames. As described above, as the execution conditions, it is also possible to perform a process of optimizing other parameters, such as the voltage value of the accelerating voltage and the current value of the probe current. In such a case, images corresponding to a plurality of accelerating voltage conditions are displayed on the display unit so that the user will select an optimal accelerating voltage condition. It should be noted that when conditions such as the accelerating voltage are set, such setting is preferably executed before the process of optimizing the number of integrated frames.

According to this embodiment, a drift correction process is executed under a plurality of drift correction conditions (i.e., the number of integrated frames), and then, the plurality of drift correction conditions and drift corrected images, which have been obtained through execution of the correction process under the plurality of drift correction conditions, are displayed in association with one another. Thus, even when image drift is generated, optimal correction conditions for the observed image can be easily determined. In addition, even when optimal drift correction conditions differ from sample to sample to be evaluated due to the diversity of production patterns to be observed, the user is able to easily set optimal conditions.

Second Embodiment

Figure 7:
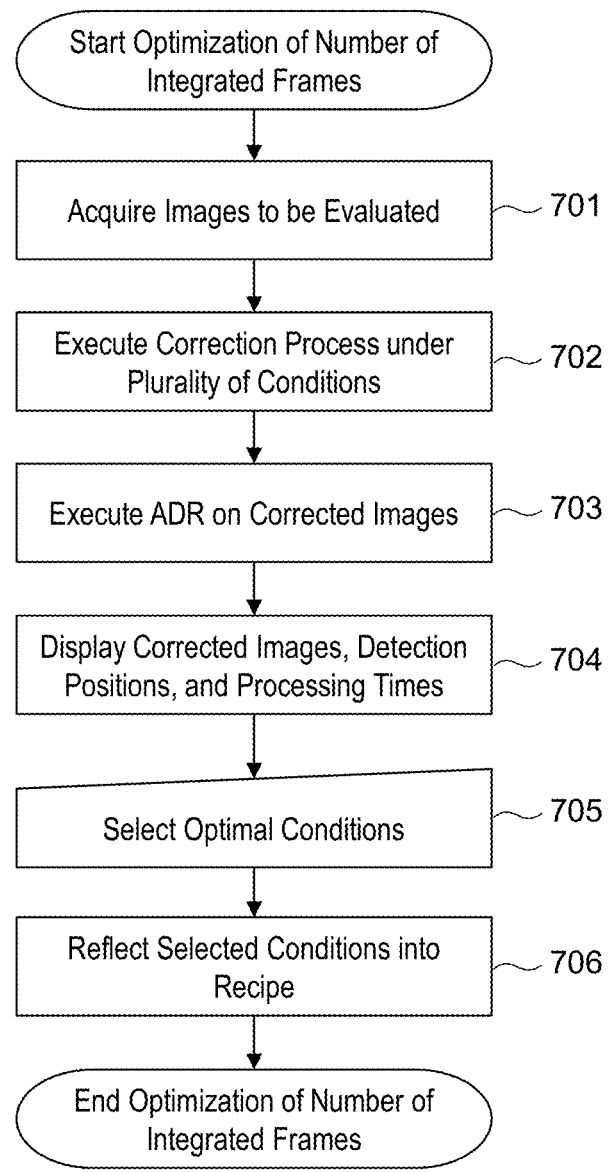
FIG. 7 is a flowchart of a condition setting process in accordance with the second embodiment, which is a flowchart of a condition setting process that can achieve both a high defect detection rate and high throughput of ADR.

Hereinafter, a process of optimizing the execution conditions in accordance with the second embodiment of the SEM defect observation apparatus will be described. The second embodiment relates to a process of setting optimal observation conditions that can achieve both a high defect detection rate and high throughput of ADR (Automatic Defect Review or Redetection). ADR is a process of acquiring a high-quality defect image by correcting errors of defect coordinates output from an upstream defect detection inspection apparatus and detecting a defect area, defect coordinates, and the like. FIG. 7 is a flowchart of a condition setting process that can achieve both a high defect detection rate and high throughput of ADR. Hereinafter, a process of optimizing the number of integrated frame images will be described as an example of the execution conditions.

When an image at defect coordinates, which have been detected with an upstream defect inspection apparatus, is automatically captured with ADR by a SEM defect observation apparatus, an image is first captured at a low magnification at about a level that allows the field of view to contain a defect, taking into consideration the defect detection coordinate accuracy of the defect inspection apparatus, and then, the defect is detected from the captured low-magnification image. Next, a high-quality high-magnification image is acquired so that the detected defect coordinates are located at the center of the field of view. It is important that for a low-magnification image from which a defect is detected, the defect be able to be detected with ADR rather than its visual impression for the user. Thus, for a low-magnification image from which a defect is detected with ADR, whether a correct defect position can be detected with ADR is an important index for setting a parameter.

Typically, a frame integrated image can have reduced noise components as the number of integrated frames is increased. Thus, in view of the defect detection rate, the number of integrated frames is desirably greater, but increasing the number of integrated frames will also increase the processing time. In particular, when a drift correction process is performed, a process of calculating the drift amount between the frame images should be performed. Thus, an increase in the processing time for integrating the frames becomes a problem. Under such conditions, optimal conditions should be set taking into consideration a balance between the defect detection rate of ADR and the throughput of ADR including the frame integration processing time. Such an item has a high difficulty level in setting a recipe.

Hereinafter, the flowchart of FIG. 7 will be described. Herein, a subject that performs the following process is the overall control unit/analysis unit 113.

In step 701, the overall control unit/analysis unit 113 first acquires from the analysis parameter storage unit 204 a plurality of parameters regarding the number of integrated frames. Then, the overall control unit/analysis unit 113 acquires from the image data storage unit 203 the maximum number of frame images to be evaluated.

Next, in step 702, the overall control unit/analysis unit 113, using the image processing unit 114, executes a drift correction process by changing the number of integrated frames for the acquired frame images (i.e., in accordance with the plurality of acquired parameters).

Next, in step 703, the overall control unit/analysis unit 113 first executes an ADR process on each frame integrated image before subjected to the drift correction process. Further, the overall control unit/analysis unit 113 executes an ADR process on each frame integrated image on which the drift correction process was executed by changing the number of integrated frames. Then, the overall control unit/analysis unit 113 stores the execution results of the ADR process into the analysis result data storage unit 205.

Next, in step 704, the overall control unit/analysis unit 113 displays on the display unit (e.g., display) of the operation unit 115 a list of the drift corrected images for the respective numbers of integrated frames, defect positions detected with ADR for the respective drift corrected images, and the throughput of ADR for the respective drift corrected images such that the correspondence therebetween can be seen. The details of the screen of the display unit of the operation unit 115 are described in detail below.

Next, in step 705, the user selects an optimal image from among the displayed list of the drift corrected images and the execution results of ADR. The overall control unit/analysis unit 113 receives information on the image selected by the user via the operation unit 115. Accordingly, it is possible to easily set optimal drift correction conditions for which ADR is taken into consideration.

Finally, in step 706, the overall control unit/analysis unit 113 reflects the optimal drift correction conditions for which ADR is taken into consideration into a recipe stored in the storage device 116. Accordingly, the optimal drift correction conditions can be applied to the next and subsequent defect observation. According to such a flowchart, the user is able to easily set optimal drift correction conditions for which ADR is taken into consideration.

Figure 8:
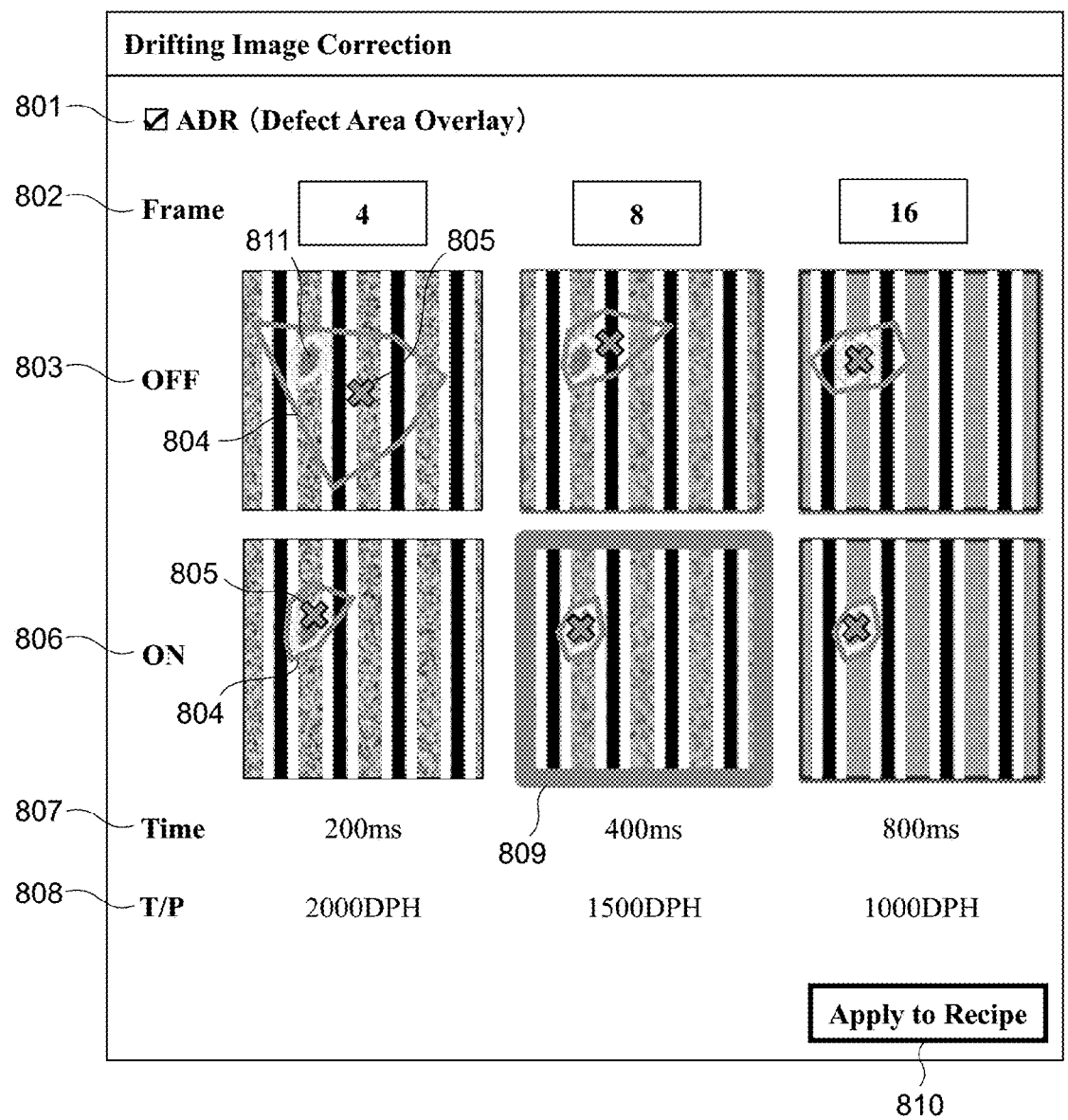
FIG. 8 illustrates an exemplary GUI for setting conditions that can achieve both a high defect detection rate and high throughput of ADR, which is an example of a screen displayed in step 704 of FIG. 7.

FIG. 8 illustrates an exemplary GUI for setting conditions that can achieve both a high defect detection rate and high throughput of ADR, which is an example of a screen displayed in step 704 of FIG. 7.

The GUI in FIG. 8 includes a display selection portion 801 for the ADR results, a display portion 802 for displaying the number of integrated frames, a pre-correction-process image display portion 803 for displaying integrated images before a correction process, a post-correction-process image display portion 806 for displaying integrated images after a correction process, a processing time display portion 807 for displaying the execution time of a correction process, and a throughput display portion 808 for displaying the throughput of ADR.

The display selection portion 801 for the ADR results is adapted to select whether to display the ADR results in an overlaid manner. If the display selection portion 801 is checked, the ADR results (i.e., a defect area 804 and defect coordinates 805) are displayed such that they are laid over the image. Although FIG. 8 illustrates an example in which a result obtained by grouping defect areas 804, which have been detected with ADR, in the shape of a polygon is displayed, it is also possible to display all of the detected defect areas in an overlaid manner without performing a grouping process. In addition, although FIG. 8 illustrates an example in which the gravity of the defect area 804 is adopted as the defect coordinates 805 detected by ADR, it is also possible to define the feature quantity (e.g., luminance) of a defect by taking a pixel value into consideration, for example, and determine the coordinates of a pixel, which has been determined to be most likely to be a defect, as the defect coordinates. Therefore, a definition corresponding to a defect detection algorithm of ADR may be adopted.

The display portion 802 for displaying the number of integrated frames displays the number of integrated frames to be evaluated to comparatively evaluate the minimum number of integrated frames, double the minimum number of integrated frames, and four times the minimum number of integrated frames. It should be noted that the number of integrated frames may be selected not only with this method but also by combining the minimum value, the median, and the maximum value. Further, the number of integrated frames need not be a fixed value, and may be freely set by the user. Furthermore, the types of the number of integrated frames that are compared are not limited to three, and it is also possible to adopt a method of displaying a list of all of the numbers of integrated frames to be evaluated, or a method of repeating a selection process a plurality of times so as to gradually narrow the numbers down to an optimal value.

The pre-correction-process image display portion 803 displays an integrated image before a correction process for each number of integrated frames. When frame images are integrated with image drift having been generated, a deviation of an edge portion of a pattern or a defect, which is contained in the resulting image to be evaluated, is displayed in a noticeable manner (thick). In the example shown in FIG. 8, the smaller the number of integrated frames, the larger the defect area 804 that is detected due to image drift and noise components. Consequently, when the number of integrated frames is 4 or 8, the defect coordinates 805 are detected such that they deviate from a defect position 811. It should be noted that samples that are subjected to defect observation also include samples that need not be subjected to a drift correction process. Thus, by displaying frame integrated images not subjected to a drift correction process, it is possible to determine whether or not a drift correction process is necessary.

The post-correction-process image display portion 806 displays an integrated image after a correction process for each number of integrated frames. As shown in FIG. 8, an image before a correction process and an image after a correction process that correspond to each number of integrated frames are displayed such that the images can be associated with the number of integrated frames. It should be noted that the correction process can reduce a deviation of an edge portion of a pattern or a defect for each number of integrated frames. Consequently, the defect area 804 becomes smaller as compared to that before the correction process. Accordingly, a deviation of the defect coordinates 805 from the defect position 811 also becomes smaller.

The processing time display portion 807 displays a drift correction processing time such that the correspondence between the drift correction processing time, each number of integrated frames, and each frame integrated image on which the ADR result is displayed can be seen. Further, the throughput display portion 808 displays the throughput of ADR including the drift correction processing time such that the correspondence between the throughput, each number of integrated frames, and each frame integrated image on which the ADR result is displayed can be seen. The processing time when ADR is applied is often discussed as the throughput of ADR including the drift correction processing time. Thus, not only the drift correction processing time (807) but also the throughput (808) of ADR is desirably displayed together.

When such a GUI is used, the user is able to easily select optimal conditions (809) from among combinations each including an image obtained by actually executing a drift correction process, an ADR result for each drift corrected image, and the throughput of ADR for each drift corrected image. When a button 810 is pressed after an optimal image is selected, the selected optimal conditions (herein, the number of integrated frames=8) are stored in a recipe as the drift correction conditions for which the next and subsequent ADR are taken into consideration.

Information similar to that on the screen exemplarily shown in FIG. 6 may also be displayed in step 704 of FIG. 7. Optimization of the drift correction condition, which takes ADR for a plurality of samples into consideration, can be implemented as in the optimization exemplarily shown in FIG. 6. FIG. 6 illustrates the cumulative frequency of an image that is determined to be optimal by the user in FIG. 5. In contrast, in order to optimize the drift correction conditions while taking ADR into consideration, it may be considered that the cumulative frequency of an image that is determined to be optimal by the user while taking ADR into consideration is displayed in FIG. 8. It should be noted that in this embodiment, not only the cumulative frequency, but also other information may be displayed. For example, an image that is determined to be optimal by the user means that correct defect coordinates have been detected. Thus, it is possible to, by comparing the defect coordinates of the image determined to be optimal by the user with defect coordinates of images obtained by integrating other numbers of frames, calculate the defect detection rate for each number of integrated frames. In such a case, the graph also displays the detection rate for each number of integrated frames. Although FIG. 6 illustrates a graph with the drift correction processing time shown on the second axis, it is also possible to, when optimization of the drift correction conditions is performed while taking ADR into consideration, display in the graph the throughput of ADR including the drift correction processing time.

According to this embodiment, even when optimal drift correction conditions differ from sample to sample due to the diversity of production patterns to be observed, it is possible to easily select drift correction conditions for which ADR is taken into consideration. In addition, as the throughput of ADR including the drift correction processing time is displayed in the setting process, it is possible to easily set conditions that can achieve both a high defect detection rate and high throughput of ADR.

Third Embodiment

Figure 9:
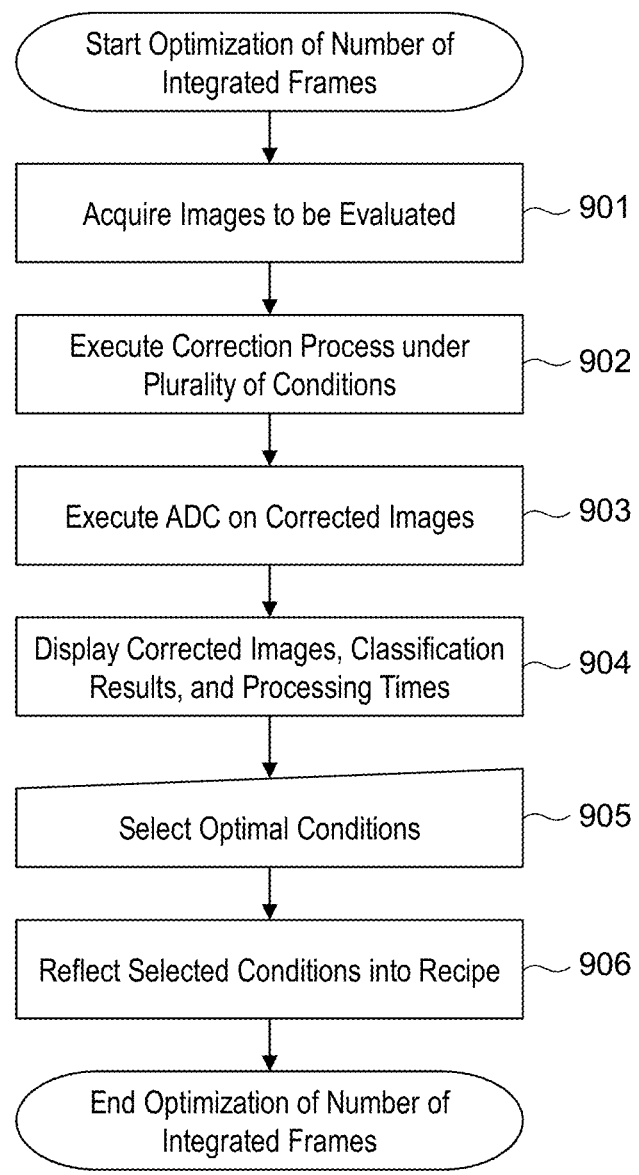
FIG. 9 is a flowchart of a condition setting process in accordance with the third embodiment, which is a flowchart of a condition setting process that can achieve both a high classification accuracy rate and high throughput of ADC.

Hereinafter, a process of optimizing the execution conditions in accordance with the third embodiment of the SEM defect observation apparatus will be described. The third embodiment relates to a process of setting optimal observation conditions that can achieve both a high classification accuracy rate and high throughput of the automatic defect classification (ADC). ADC is a process of classifying defects by type (i.e., identifying the types of defects) on the basis of a defect image acquired with high image quality. FIG. 9 is a flowchart of a condition setting process that can achieve both a high classification accuracy rate and high throughput of ADC. Hereinafter, a process of optimizing the number of integrated frame images will be described as an example of the execution conditions.

In order to obtain a high accuracy rate with ADC, it is necessary to analyze defects with high image quality. Thus, the conditions to acquire a high-magnification image to be subjected to ADC are important. Depending on the algorithm of ADC, not only a high-magnification image but also a low-magnification image may be used. However, description will be hereinafter made on the assumption that an image that has a large influence on the accuracy rate of ADC is a high-magnification image.

Typically, a frame integrated image that has been subjected to drift correction can have reduced noise components as the number of integrated frames is increased. Thus, in view of the classification accuracy rate of ADC, the number of integrated frames is desirably greater, but increasing the number of integrated frames will also increase the processing time of ADC including the drift correction processing time. In addition, the image quality that is suitable for visual classification for the user is not necessarily identical to the image quality with which a sufficient accuracy rate of ADC is obtained. Thus, it is necessary to set optimal conditions while considering a balance between the classification accuracy rate of ADC, the number of integrated frames, and the processing time of ADC including the drift correction processing time. Therefore, optimization of conditions that can achieve both a high classification accuracy rate and high throughput of ADC is an operation with a high difficulty level when setting a recipe.

Hereinafter, a flowchart in FIG. 9 will be described. Herein, a subject that performs the following process is the overall control unit/analysis unit 113.

In step 901, the overall control unit/analysis unit 113 first acquires from the analysis parameter storage unit 204 a plurality of parameters regarding the number of integrated frames. Then, the overall control unit/analysis unit 113 acquires from the image data storage unit 203 the maximum number of frame images to be evaluated.

Next, in step 902, the overall control unit/analysis unit 113, using the image processing unit 114, executes a drift correction process by changing the number of integrated frames for the acquired frame images (i.e., in accordance with the plurality of acquired parameters).

Next, in step 903, the overall control unit/analysis unit 113 first executes an ADC process on each frame integrated image before subjected to the drift correction process. Further, the overall control unit/analysis unit 113 executes an ADC process on each frame integrated image on which the drift correction process was executed by changing the number of integrated frames. Then, the overall control unit/analysis unit 113 stores the execution results of the ADC process into the analysis result data storage unit 205.

Next, in step 904, the overall control unit/analysis unit 113 displays on the display unit (e.g., display) of the operation unit 115 a list of the drift corrected images for the respective numbers of integrated frames, the classification results of ADC for the respective drift corrected images, and the throughput of ADC for the respective drift corrected images such that the correspondence therebetween can be seen. The details of the screen of the display unit of the operation unit 115 are described below.

Next, in step 905, the user selects an optimal image from among the displayed list of the drift corrected images and the classification results of ADC. The overall control unit/analysis unit 113 receives information on the image selected by the user via the operation unit 115. Accordingly, it is possible to easily set optimal drift correction conditions for which ADC is taken into consideration.

Finally, in step 906, the overall control unit/analysis unit 113 reflects the optimal drift correction conditions for which ADC is taken into consideration into a recipe stored in the storage device 116. Accordingly, the drift correction conditions can be applied to the next and subsequent defect observation. According to such a flowchart, the user is able to easily set optimal drift correction conditions for which ADC is taken into consideration.

Figure 10:
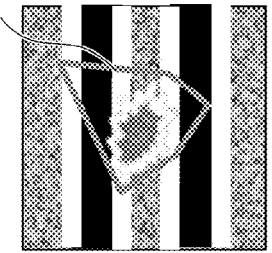
FIG. 10 illustrates an exemplary GUI for setting conditions that can achieve both a high classification accuracy rate and high throughput of ADC, which is an example of a screen displayed in step 904 of FIG. 9.

FIG. 10 illustrates an exemplary GUI for setting conditions that can achieve both a high classification accuracy rate and high throughput of ADC, which is an example of a screen displayed in step 904 of FIG. 9.

The GUI in FIG. 10 includes a display selection portion 1001 for the ADC results, a display portion 1002 for displaying the number of integrated frames, a pre-correction-process image display portion 1003 for displaying integrated images before a correction process, a first ADC result display portion 1004 for displaying the ADC results for integrated images before a correction process, a post-correction-process image display portion 1006 for displaying integrated images after a correction process, a second ADC result display portion 1007 for displaying the ADC results for integrated images after a correction process, a processing time display portion 1008 for displaying the execution time of a correction process, and a throughput display portion 1009 for displaying the throughput of ADC.

The display selection portion 1001 for the ADC results selects whether or not to display the ADC results in an overlaid manner. When the display selection portion 1001 is checked, the ADC results (i.e., a defect area 1005, the first ADC result display portion 1004, and the second ADC result display portion 1007) are displayed. Although FIG. 10 illustrates an example in which a result obtained by grouping defect areas 1005, which have been detected with ADC, in the shape of a polygon is displayed, it is also possible to display all of the detected defect areas in an overlaid manner without performing a grouping process.

The display portion 1002 for displaying the number of integrated frames displays the number of integrated frames to be evaluated to comparatively evaluate the minimum number of integrated frames, double the minimum number of integrated frames, and four times the minimum number of integrated frames. It should be noted that the number of integrated frames may be selected not only with this method but also by combining the minimum value, the median, and the maximum value. Further, the number of integrated frames need not be a fixed value, and may be freely set by the user. Furthermore, the types of the number of integrated frames that are compared are not limited to three, and it is also possible to adopt a method of displaying a list of all of the numbers of integrated frames to be evaluated, or a method of repeating a selection process a plurality of times so as to gradually narrow the numbers down to an optimal value.

The pre-correction-process image display portion 1003 displays an integrated image before a correction process for each number of integrated frames. When frame images are integrated with image drift having been generated, a deviation of an edge portion of a pattern or a defect, which is contained in the resulting image to be evaluated, is displayed in a noticeable manner (bright). In the example shown in FIG. 10, the smaller the number of integrated frames, the larger the defect area 1005 that is detected due to image drift and noise components. It should be noted that samples that are subjected to defect observation also include samples that need not be subjected to a drift correction process. Thus, by displaying frame integrated images not subjected to a drift correction process, it is possible to determine whether or not a drift correction process is necessary.

The first ADC result display portion 1004 displays the ADC result for an integrated image before a correction process for each number of integrated frames. In the example of FIG. 10, when the number of integrated frames is 4, the classification result of ADC is not determined, and thus, "Unknown" is displayed. When the number of integrated frames is 8, the result is classified as "Short." In this example, a correct classification result is not obtained. When the number of integrated frames is 16, the result is classified as "Dust" (foreign matter). Thus, a correct classification result is obtained.

The post-correction-process image display portion 1006 displays an integrated image after a correction process for each number of integrated frames. As shown in FIG. 10, an image before a correction process and an image after a correction process that correspond to each number of integrated frames are displayed such that the images can be associated with the number of integrated frames. It should be noted that the correction process can reduce a deviation of an edge portion of a pattern or a defect for each number of integrated frames. Consequently, the defect area 1005 becomes smaller as compared to that before the correction process.

The second ADC result display portion 1007 displays the ADC result for an integrated image after a correction process for each number of integrated frames. In the example of FIG. 10, when the number of integrated frames is 4, the classification result of ADC is not determined even after a correction process, and thus, "Unknown" is displayed. When the number of integrated frames is 8, the result is classified as "Dust," and a correct result is obtained as compared to that before a correction process. When the number of integrated frames is 16, the result is classified as "Dust."

In addition, the drift correction processing time is displayed in the processing time display portion 1008 such that the correspondence between the drift correction processing time, each number of integrated frames, and each frame integrated image on which the ADC result is displayed can be seen. Further, the throughput of ADC including the drift correction processing time is displayed in the throughput display portion 1009 such that the correspondence between the throughput, each number of integrated frames, and each frame integrated image on which the ADC result is displayed can be seen. The processing time when ADC is applied is often discussed as the throughput of ADC including the drift correction processing time. Thus, not only the drift correction processing time (1008) but also the throughput (1009) of ADR is desirably displayed together. It should be noted that the ADC process is often subjected to pipeline processing in parallel with the ADR process. In particular, depending on the number of samples to be processed, there may be cases where the throughput of ADC is about equal to that of ADR. Thus, herein, the throughput of ADC and that of ADR are displayed without particular distinction. However, if the throughput of ADC is to be accurately recognized, the throughput of ADC and that of ADR may be separately displayed.

When such a GUI is used, the user is able to easily select optimal conditions (1010) from among combinations each including an image obtained by actually executing a drift correction process, an ADC result for each drift corrected image, and the throughput of ADC for each drift corrected image. When a button 1011 is pressed after an optimal image is selected, the selected optimal conditions (herein, the number of integrated frames=8) are stored in a recipe as the drift correction conditions for which the next and subsequent ADC are taken into consideration.

Information similar to that on the screen exemplarily shown in FIG. 6 may also be displayed in step 904 of FIG. 9. Optimization of the drift correction conditions that takes ADC for a plurality of samples into consideration can be implemented as in the optimization exemplarily shown in FIG. 6. FIG. 6 illustrates the cumulative frequency of an image that is determined to be optimal by the user. In contrast, in order to optimize the drift correction conditions while taking ADC into consideration, it may be considered that the cumulative frequency of an image that is determined to be optimal by the user while taking ADC into consideration is displayed in FIG. 10. It should be noted that in this embodiment, not only the cumulative frequency, but also other information may be displayed. For example, an image that is determined to be optimal by the user means an image on which accurate defect classification has been performed. Thus, it is possible to, by comparing the ADC result for the image determined to be optimal by the user with the ADC results for images obtained by integrating other numbers of frames, calculate the defect classification accuracy rate for each number of integrated frames. In such a case, the graph also displays the defect classification accuracy rate for each number of integrated frames. Although FIG. 6 illustrates a graph with the drift correction processing time shown on the second axis, it is also possible to, when optimization of the drift correction conditions is performed while taking ADC into consideration, display in the graph the throughput of ADC including the drift correction processing time.

According to this embodiment, even when optimal drift correction conditions differ from sample to sample due to the diversity of production patterns to be observed, it is possible to easily select drift correction conditions for which ADC is taken into consideration. In addition, as the throughput of ADC including the drift correction processing time is displayed in the setting process, it is possible to easily set conditions that can achieve both a high defect classification accuracy rate and high throughput of ADC.

Fourth Embodiment

Figure 11:
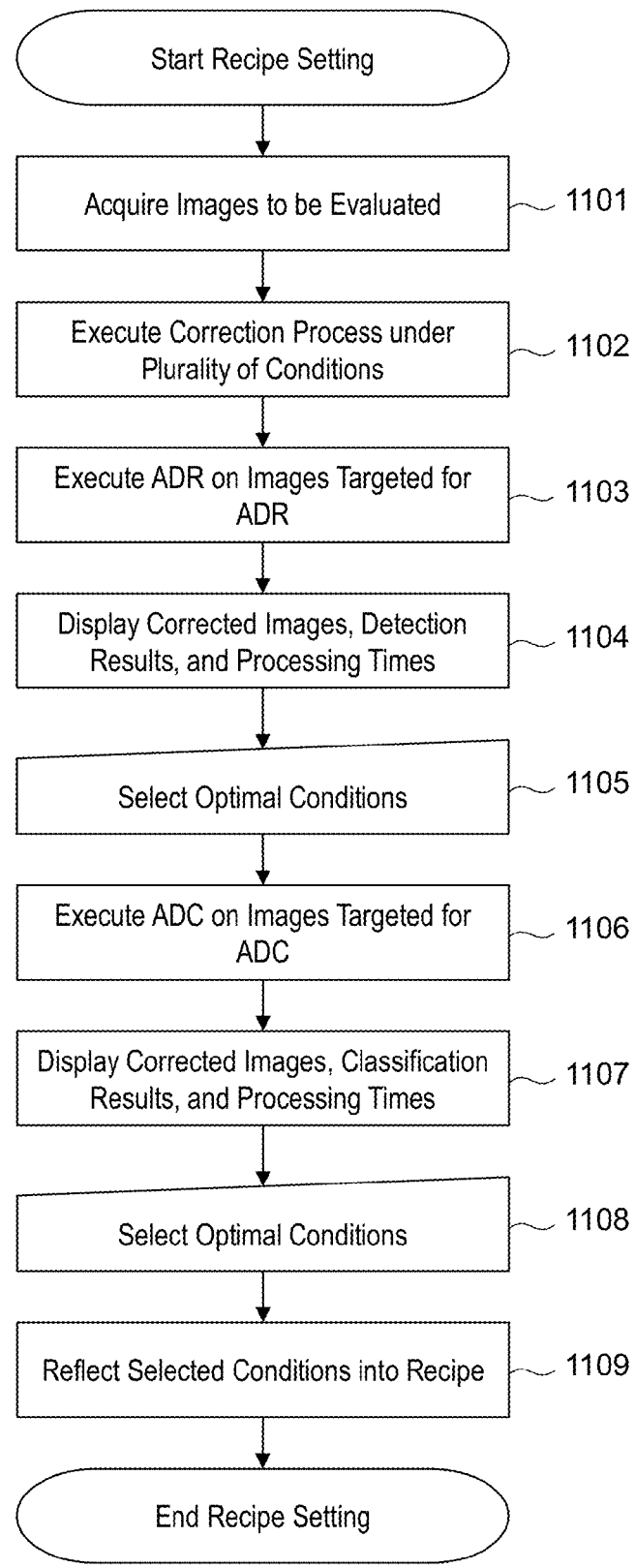
FIG. 11 is a flowchart of a condition setting process in accordance with the fourth embodiment, which is a flowchart of a condition setting process that can achieve both a high defect detection rate and high throughput of ADR and can also achieve both a high classification accuracy rate and high throughput of ADC.

Hereinafter, a process of optimizing the execution conditions in accordance with the fourth embodiment of the SEM defect observation apparatus will be described. The fourth embodiment relates to a process of setting observation conditions that can achieve both a high defect detection rate and high throughput of ADR and can also achieve both a high classification accuracy rate and high throughput of ADC. FIG. 11 is a flowchart of a condition setting process that can achieve both a high defect detection rate and high throughput of ADR and can also achieve both a high classification accuracy rate and high throughput of ADC. Hereinafter, a process of optimizing the number of integrated frame images will be described as an example of the execution conditions.

FIG. 11 illustrates a combination of the flow exemplarily shown in FIG. 7 and the flow exemplarily shown in FIG. 8. Herein, a subject that performs the following process is the overall control unit/analysis unit 113.

In step 1101, the overall control unit/analysis unit 113 acquires from the analysis parameter storage unit 204 a plurality of parameters regarding the number of integrated frames. Then, the overall control unit/analysis unit 113 acquires from the image data storage unit 203 the maximum number of frame images to be evaluated.

Next, in step 1102, the overall control unit/analysis unit 113, using the image processing unit 114, executes a drift correction process by changing the number of integrated frames for the acquired frame images (i.e., in accordance with the plurality of acquired parameters).

Next, in step 1103, the overall control unit/analysis unit 113 first executes an ADR process on each frame integrated image before subjected to the drift correction process. Further, the overall control unit/analysis unit 113 executes an ADR process on each frame integrated image on which the drift correction process was executed by changing the number of integrated frames. Then, the overall control unit/analysis unit 113 stores the execution results of the ADR process into the analysis result data storage unit 205.

Next, in step 1104, the overall control unit/analysis unit 113 displays on the display unit (e.g., display) of the operation unit 115 a list of the drift corrected images for the respective numbers of integrated frames, defect positions detected with ADR for the respective drift corrected images, and the throughput of ADR for the respective drift corrected images such that the correspondence therebetween can be seen. Herein, the screen in FIG. 8 is displayed.

Next, in step 1105, the user selects an optimal image from among the displayed list of the drift corrected images and the execution results of ADR. The overall control unit/analysis unit 113 receives information on the image selected by the user via the operation unit 115.

Next, in step 1106, the overall control unit/analysis unit 113 first executes an ADC process on each frame integrated image before subjected to the drift correction process. Further, the overall control unit/analysis unit 113 executes an ADC process on each frame integrated image on which the drift correction process was executed by changing the number of integrated frames. Then, the overall control unit/analysis unit 113 stores the execution results of the ADC process into the analysis result data storage unit 205.

Next, in step 1107, the overall control unit/analysis unit 113 displays on the display unit (e.g., display) of the operation unit 115 a list of the drift corrected images for the respective numbers of integrated frames, the classification results of ADC for the respective drift corrected images, and the throughput of ADC for the respective drift corrected images such that the correspondence therebetween can be seen. Herein, the screen in FIG. 10 is displayed.

Next, in step 1108, the user selects an optimal image from among the displayed list of the drift corrected images and the classification results of ADC. The overall control unit/analysis unit 113 receives information on the image selected by the user via the operation unit 115.

Finally, in step 1109, the overall control unit/analysis unit 113 reflects the optimal drift correction conditions for which ADR is taken into consideration and the optimal drift correction conditions for which ADC is taken into consideration into a recipe stored in the storage device 116.

According to such a flowchart, the user is able to easily set optimal conditions that can achieve both a high defect detection rate and high throughput of ADR as well as optimal conditions that can achieve both a high classification accuracy rate and high throughput of ADC.

According to this embodiment, the drift correction conditions of ADR and ADC can be set in succession. As described above, there are also cases where the throughput of ADC is not equal to that of ADR. Thus, for example, the throughput of ADC and that of ADR can also be displayed separately in step 1107. In such a case, it is possible to determine optimal drift correction conditions by comparing the throughput of ADC with that of ADR. In addition, when the drift correction conditions of ADR and ADC are set in succession, it is possible to use the drift corrected image, which has been processed in step 1102, as it is in step 1106, and thus, it is possible to reduce the processing time.

The present invention is not limited to the aforementioned embodiments, and includes a variety of variations. For example, although the aforementioned embodiments have been described in detail to clearly illustrate the present invention, the present invention need not include all of the structures described in the embodiments. It is possible to replace a part of a structure of an embodiment with a structure of another embodiment. In addition, it is also possible to add, to a structure of an embodiment, a structure of another embodiment. Further, it is also possible to, for a part of a structure of each embodiment, add/remove/substitute a structure of another embodiment.

In addition, as described above, each of the overall control unit/analysis unit 113 and the image processing unit 114 may be implemented by a program code of software that implements the functions of the embodiments. In such a case, a storage medium having a program code recorded thereon may be provided to an information processing device, and the information processing device (or a CPU) may read the program code stored in the storage medium. In such a case, the program code read from the storage medium implements the functions of the aforementioned embodiments, and the program code and the storage medium having the program code recorded thereon constitute the present invention. As the storage medium for supplying such a program code, for example, a flexible disk, CD-ROM, DVD-ROM, a hard disk, an optical disc, a magneto-optical disc, CD-R, a magnetic tape, a nonvolatile memory card, ROM, or the like is used. It should be noted that the existing device may be upgraded by a recording medium having a program recorded thereon.

Further, based on an instruction of the program code, an OS (operating system) running on the information processing device or the like may perform some or all of actual processes, and the functions of the aforementioned embodiments may be implemented by those processes. Moreover, the program code of the software that implements the functions of the embodiments may be distributed via a network, and thereby stored in a storage device of the information processing device or the storage medium such as CD-RW or CD-R, and at the point of use, the CPU of the information processing device may read and execute the program code stored in the storage device or the storage medium.

Although the present invention has been described with reference to specific examples, they are not for limiting purposes but for illustrative purposes in all aspects. One of ordinary skill in the art would appreciate that there is a number of combinations of hardware, software, and firmware that are suitable for implementing the present invention. For example, the program code that implements the function described in this embodiment can be implemented by a wide range of programs or scripting languages, such as an assembler, C/C++, perl, Shell, PHP, and Java (registered trademark).

In addition, control lines and information lines in the drawings represent those that are considered to be necessary for the description, and do not necessarily represent all control lines and information lines that are necessary for a product. All structures may also be mutually connected.

REFERENCE SIGNS LIST

101 Electron gun
102 Lens
103 Scanning deflector
104 Objective lens
105 Sample
106 Stage
107 Primary electron beam
108 Secondary particles
109 Secondary particle detector
110 Electron optical system control unit
111 A/D converter unit
112 Stage control unit
113 Overall control unit/analysis unit
114 Image processing unit
115 Operation unit
116 Storage device
117 Optical microscope
201 Operation/analysis unit 202 Defect data storage unit
203 Image data storage unit
204 Analysis parameter storage unit
205 Analysis result data storage unit

The invention claimed is:

1. A charged-particle beam apparatus with a defect observation device for observing a defect on a sample, the apparatus comprising:
a control unit; and
a display unit,
wherein the control unit is configured to:
acquire a plurality of frame images to be integrated from the defect observation device,
generate a plurality of integrated images having different numbers of frames while executing a drift correction process, and
display (i) the plurality of integrated images, and (ii) at least one of the number of frames for each integrated image and a time required for image processing in association with each other, as a first screen on the display unit, wherein the time varies depending on the number of frames.

2. The charged-particle beam apparatus according to claim 1, wherein the control unit is configured to execute an automatic defect observation process on the plurality of corrected images, and display on the first screen defect positions detected through the automatic defect observation process such that the defect positions are laid over the respective corrected images.

3. The charged-particle beam apparatus according to claim 2, wherein the control unit is configured to display on the first screen throughput information on the automatic defect observation process executed on the plurality of corrected images in association with the respective correction conditions.

4. The charged-particle beam apparatus according to claim 2, wherein the control unit is configured to display at least one of a cumulative frequency of results determined to be optimal by the user for a plurality of evaluated samples by the plurality of correction conditions and a detection rate of the automatic defect observation process for each of the plurality of correction conditions, as a second screen on the display unit.

5. The charged-particle beam apparatus according to claim 4, wherein the control unit is configured to display on the second screen at least one of an execution time of the drift correction process on the one or more images and throughput information on the automatic defect observation process executed on each of the plurality of corrected images.

6. The charged-particle beam apparatus according to claim 1, wherein the control unit is configured to execute an automatic defect classification process on the plurality of corrected images, and display on the first screen classification results obtained through the automatic defect classification process in association with the respective corrected images.

7. The charged-particle beam apparatus according to claim 6, wherein the control unit is configured to display on the first screen throughput information on the automatic defect classification process executed on the plurality of corrected images in association with the respective correction conditions.

8. The charged-particle beam apparatus according to claim 6, wherein the control unit is configured to display at least one of a cumulative frequency of results determined to be optimal by the user for a plurality of evaluated samples by the plurality of correction conditions and an accuracy rate of the automatic defect classification process for each of the plurality of correction conditions, as a second screen on the display unit.

9. The charged-particle beam apparatus according to claim 8, wherein the control unit is configured to display on the second screen at least one of an execution time of the drift correction process on the one or more images and throughput information on the automatic defect classification process executed on each of the plurality of corrected images.

10. The charged-particle beam apparatus according to claim 1, wherein the control unit is configured to display on the first screen an execution time of the drift correction process on the one or more images in association with each of the plurality of correction conditions.

11. The charged-particle beam apparatus according to claim 1, wherein the control unit is configured to display on the first screen the one or more images before the drift correction process in association with the each of the plurality of correction conditions.

12. The charged-particle beam apparatus according to claim 1, wherein the control unit is configured to display a cumulative frequency of results determined to be optimal by the user for a plurality of evaluated samples by the plurality of correction conditions as a second screen on the display unit.

13. The charged-particle beam apparatus according to claim 12, wherein the control unit is configured to display on the second screen an execution time of the drift correction process on the one or more images in association with the distribution of the plurality of correction conditions.

14. The charged-particle beam apparatus according to claim 1, wherein
the control unit is configured to execute an automatic defect observation process on the plurality of corrected images, and display on the first screen defect positions obtained through the automatic defect observation process such that the defect positions are laid over the respective corrected images, and
the control unit is configured to execute an automatic defect classification process on the plurality of corrected images, and display on the second screen classification results obtained through the automatic defect classification process in association with the respective corrected images.

15. The charged-particle beam apparatus according to claim 14, wherein the control unit is configured to separately display on the second screen throughput information on the automatic defect observation process executed on each of the plurality of corrected images and throughput information on the automatic defect classification process executed on each of the plurality of corrected images.

16. A charged-particle beam apparatus with a defect observation device for observing a defect on a sample, the apparatus comprising:
a control unit; and
a display unit,
wherein the control unit is configured to:
acquire a plurality of frame images to be integrated from the defect observation device,
generate a plurality of integrated images having different numbers of frames while executing a drift correction process,
detect at least one of a defect area and defect coordinates from each of the plurality of integrated images, display (i) the plurality of integrated images, and (ii) at least one of the defect area and the defect coordinates in an overlaid manner, and display (i) the plurality of integrated images, and (ii) at least one of the number of frames for each integrated image and a time required for image processing in association with each other, on the display unit, wherein the time varies depending on the number of frames.

17. A charged-particle beam apparatus with a defect observation device for observing a defect on a sample, the apparatus comprising:

a control unit; and
a display unit,
wherein the control unit is configured to:
acquire a plurality of frame images to be integrated from the defect observation device,
generate a plurality of integrated images having different numbers of frames while executing a drift correction process,
detect at least one of a defect area and defect coordinates from each of the plurality of integrated images,
classify the detected defects by type of defect, and
display the plurality of integrated images and information of the classified defect in association with each other, on the display unit.

* * * * *